(12) United States Patent
Hongo

(10) Patent No.: US 10,203,375 B2
(45) Date of Patent: Feb. 12, 2019

(54) METHOD FOR ASCERTAINING STORAGE BATTERY STATE, STATE-ASCERTAINING SYSTEM, AND COMPUTER PROGRAM

(71) Applicant: NEC Corporation, Tokyo (JP)

(72) Inventor: Hiroo Hongo, Tokyo (JP)

(73) Assignee: NEC Corporation, Tokyo (JP)

( * ) Notice: Subject to any disclaimer, the term of this patent is extended or adjusted under 35 U.S.C. 154(b) by 195 days.

(21) Appl. No.: 15/036,699

(22) PCT Filed: Nov. 13, 2014

(86) PCT No.: PCT/JP2014/080121
§ 371 (c)(1),
(2) Date: May 13, 2016

(87) PCT Pub. No.: WO2015/072528
PCT Pub. Date: May 21, 2015

(65) Prior Publication Data
US 2016/0356856 A1    Dec. 8, 2016

(30) Foreign Application Priority Data

Nov. 14, 2013  (JP) .................................. 2013-236249

(51) Int. Cl.
*G01R 31/36* (2006.01)
*H02J 7/00* (2006.01)
*H01M 10/48* (2006.01)

(52) U.S. Cl.
CPC ..... *G01R 31/3651* (2013.01); *G01R 31/3634* (2013.01); *G01R 31/3679* (2013.01);
(Continued)

(58) Field of Classification Search
CPC ............ G01R 31/3634; G01R 31/3651; G01R 31/361; G01R 31/3679; H01M 10/48; H02J 7/0047
See application file for complete search history.

(56) References Cited

U.S. PATENT DOCUMENTS

| 2005/0156577 A1 | 7/2005 | Sully |
| 2009/0198372 A1* | 8/2009 | Hammerslag ....... B60L 11/1822 |
| | | 700/226 |

(Continued)

FOREIGN PATENT DOCUMENTS

| JP | 2002-247773 | 8/2002 |
| JP | 2004-191152 | 7/2004 |

(Continued)

OTHER PUBLICATIONS

International Search Report and Written Opinion dated Feb. 24, 2015, in corresponding PCT International Application.

(Continued)

*Primary Examiner* — Bryan Bui
(74) *Attorney, Agent, or Firm* — Finnegan, Henderson, Farabow, Garrett & Dunner, L.L.P.

(57) ABSTRACT

This method for ascertaining the state of a fixed storage battery has: (a1) a step for storing operating history data for a storage battery; (a2) a step in which the storage battery is completely discharged and the charging energy required to fully charge the storage battery is measured by a charge amount measurement device, thereby updating, at regular intervals, data on the charging energy required for the storage battery to be fully charged; and (a3) a step for estimating the electric storage capacity of the storage battery from the operating history data and the updated data on the charging energy required for the storage battery to be fully charged.

2 Claims, 12 Drawing Sheets

(52) U.S. Cl.
CPC .......... *H01M 10/48* (2013.01); *H02J 7/0047* (2013.01); *G01R 31/361* (2013.01)

(56) References Cited

U.S. PATENT DOCUMENTS

2012/0126744 A1     5/2012   Kuroda et al.
2014/0333265 A1*   11/2014   Kinjo ................. G01R 31/3624
                                                                               320/134

FOREIGN PATENT DOCUMENTS

| JP | 2011-153951 | 8/2011 |
|---|---|---|
| JP | 2012-185124 | 9/2012 |
| JP | 2013-145095 | 7/2013 |
| WO | WO 2011/018959 A1 | 2/2011 |
| WO | WO 2011/125213 A1 | 10/2011 |
| WO | WO 2012/105492 A1 | 8/2012 |
| WO | WO 2012/133274 A1 | 10/2012 |
| WO | WO 2013/002343 A1 | 1/2013 |

OTHER PUBLICATIONS

Notification of Reasons for Refusal dated Jul. 30, 2018 issued by the Japanese Patent Office in counterpart Japanese Patent Application No. 2015-547794.

* cited by examiner

Fig.4

| date time | mode | temp. /°C | power | SOC | full cap. |
|---|---|---|---|---|---|
| 20xx/y/zz 22:45 | rest | 13 | 0 | 30 | 49.5 |
| 20xx/y/zz 23:00 | charge | 17 | 0 | 35 | 49.5 |
| 20xx/y/zz 23:15 | charge | 20 | 2.6 | 41 | 49.5 |
| 20xx/y/zz 23:30 | charge | 23 | 2.9 | 49 | 49.5 |
| 20xx/y/zz 23:45 | charge | 24 | 3.0 | 55 | 49.5 |
| 20xx/y/zy 00:00 | charge | 20 | 3.1 | 62 | 49.5 |
| ... | ... | ... | ... | ... | ... |

METHOD FOR ASCERTAINING STORAGE BATTERY STATE, STATE-ASCERTAINING SYSTEM, AND COMPUTER PROGRAM

CROSS-REFERENCE TO RELATED PATENT APPLICATIONS

This application is a National Stage Entry of International Application No. PCT/JP2014/080121, filed Nov. 13, 2014, which claims priority from Japanese Patent Application No. 2013-236249, filed Nov. 14, 2013. The entire contents of the above-referenced applications are expressly incorporated herein by reference.

TECHNICAL FIELD

The present invention relates to a method for ascertaining a state of the storage battery, a state ascertaining system and a computer program, in particular, to a method for ascertaining a state of the storage battery, state ascertaining system and a computer program with low cost construction, which enable the estimation of the chargeable storage capacity of the storage battery without restricting the use of the user as much as possible.

BACKGROUND ART

With the recent development of technology, in addition to electric vehicle applications, a large-scale lithium ion secondary battery for the purpose of electric energy storage has been put to practical use. These large-scale storage batteries for electric energy storage are installed in houses and offices or in premises of electric power companies, and the term of operation thereof is assumed to be 10-year period or longer. Those used for such applications are also referred to stationary storage batteries, and are distinguished from storage batteries mounted in electronic devices, vehicles or the like.

For the large-scale lithium ion secondary battery expected to be used for 10-year or longer, it is necessary to ascertain the state of battery as maintenance and management. For example, continuous monitoring of the temperature is important for judging abnormalities such as heat generation. In addition, the assessment of the available battery capacity (also referred to as chargeable storage capacity) is required for judging necessity of a maintenance work of the battery.

Incidentally, the deterioration of lithium ion secondary batteries progresses with the use thereof, and it is known that an available battery capacity decreases. In case that the battery capacity decreases faster than expected due to certain abnormality, or in case that it decreases below a guaranteed capacity within a warranty period, maintenance and replacement is necessary.

If the timing of these maintenance and replacement can be scheduled in advance, the arrangement of servicepersons and procurement of spare parts can be carried out in planed manner. If this is realized, the operation stopping period of the storage battery can be scheduled, and therefore inconvenience to users is reduced and satisfaction of users will be improved. The systematic procurement of parts allows to minimize the stock thereof and to reduce unnecessary cost.

One of the simplest methods to ascertain a chargeable storage capacity is discharging a storage battery completely after charging it to fully charged state (see also paragraph [0005] etc. of Patent Document 1 although it is for vehicles), and determining the capacity during the discharge.

However, depending on a user, the complete discharge of a battery seldom takes place. This is because, for example, there are users who want to keep an electric energy more than SOC 30% all the time. In addition, depending on a user, because of the low use of electric energy during the daytime, there is a case that a complete discharge is not attained. In these cases, it is technically possible to forcibly discharge by some ways, for example, such a way as to suppress the charging for a certain period of time. However, frequent forced operations which are irrelevant to user's intention restrict the use of the user, impairing the convenience.

Then, as another method for ascertaining the battery capacity, also conceivable method is to analyze the log data of the lithium-ion secondary battery and estimates the amount of deterioration.

However, in this case, it is necessary to obtain the charge and discharge curve with high accuracy to some extent, and it is desirable to charge after fully discharged even in this method. Therefore, this method also has a problem to impose restrictions on the use of the user.

Besides these, there is also a method of estimating the amount of reduction in battery capacity by measuring electric impedance or resistance. However, such an approach requires a measuring mechanism other than the mechanisms for the measurement of current, voltage and electric power, leading to increase in cost.

As seen above, there is a need for ascertaining a chargeable storage capacity of a storage battery in a manner that does not cause the increase in cost and does not impair convenience for users.

CITATION LIST

Patent Literature

Patent Document 1: WO2012/105492

SUMMARY OF INVENTION

Technical Problem

The present invention relates to a stationary storage battery installed in houses, offices and the like, and the object thereof is to provide a method for ascertaining a state of the storage battery, a state ascertaining system and a computer program with low cost construction, which enable the estimation of the chargeable storage capacity of the storage battery without restricting the use of users as much as possible.

Solution To Problem

A method according to an embodiment of the present invention for achieving the above object is as follows:
1. A method for ascertaining a state of a stationary storage battery, comprising:
   (a1) storing operating history data of a storage battery;
   (a2) discharging the storage battery completely and updating data of an amount of charge at fully charged state, at regular intervals; and
   (a3) estimating a chargeable storage capacity of the storage battery from the operating history data and the updated data of the amount of charge at fully charged state.

According to this configuration, since the data of the amount of charge obtained by the charge measuring device (e.g. coulomb counter) at fully charged state is updated, accumulation of errors is prevented and estimation of the chargeable storage capacity becomes more accurate. Moreover, since this update (reset) is carried out at regular intervals that do not impair the convenience of users, the users do not frequently experience cases in which batteries are unusable.

(Definition of Terms)

"Storage battery" used herein means those in which deterioration progresses with use, and chargeable storage capacity decreases, such as lithium ion secondary batteries.

"At regular intervals" means that the interval from the last update to the update of this time is a period or longer (for example 3 months or more, or six months or more), and does not necessarily mean that the intervals have equal length.

Effect Of The Invention

According to the present invention, there is provided a method for ascertaining a state of the storage battery, a state ascertaining system and a computer program with low cost construction, which enable the estimation of the chargeable storage capacity of the storage battery without restricting the use of users as much as possible.

BRIEF DESCRIPTION OF DRAWINGS

FIG. 4 is a diagram showing an example of operational profiles that are stored in the operational profile unit.

DESCRIPTION OF EMBODIMENTS

Next, embodiments of the present invention will now be described in detail with reference to the drawings. Herein, the configuration described below is only an example of the present invention, and specific configurations can be changed appropriately.

Figure 1:
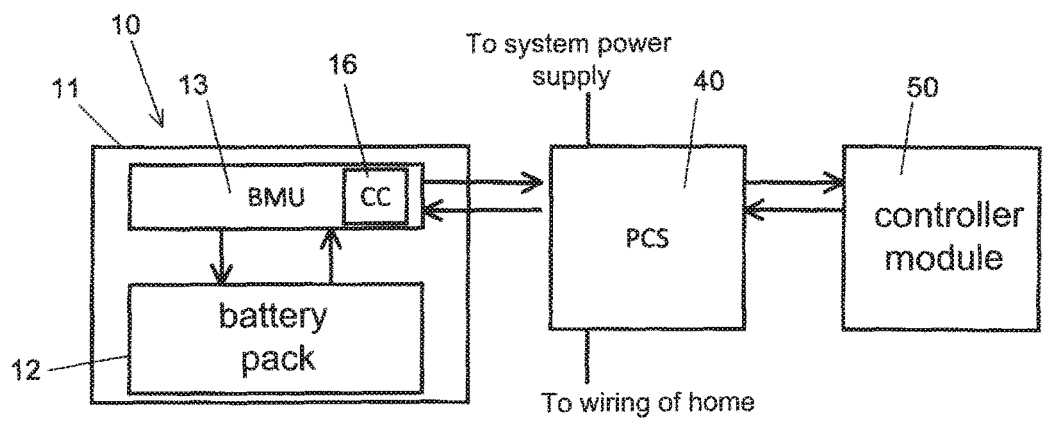
FIG. 1 is a block diagram schematically showing the entire power storage device and the power storage system installed at home.

A lithium ion secondary battery system shown in FIG. 1 has, as an example, a power storage device 10, and PCS (Power Control System) 40 connected thereto, and a controller module 50 connected thereto.

The power storage device 10 is intended for a stationary system having capacity of several KWh to several tens KWh, for example. Specifically, the power storage device 10 may include a battery pack 12, BMU 13 (Buttery Management Unit), and a housing 11 for housing them. Although the battery pack 12 and BMU 13 are depicted separately in the drawing, the configuration in which a BMU 13 is accommodated in a battery pack 12 may also be referred to as a "battery pack".

The battery pack 12, in an example, may have a plurality of modules formed from several to about 20 battery cells. The battery cells may be connected in series or in parallel in each module.

Although not shown in FIG. 1, the power storage device 10 is provided with a voltage monitor and a current monitor, by which the voltage value of each cell is obtained, and also the charging and discharging current flowing in the cells connected in series can be obtained. Charge current value and discharge current value of each cell can be monitored and observed by a cell-balance circuit.

BMU 13 observes one or more of the voltage monitor, the current monitor, and a temperature monitor of each battery cell. BMU 13 also has the ability to communicate with a PCS 40 described later, and ensures safety during charge and/or discharge while or after communicating with PCS 40. BMU 13 has a coulomb counter (CC) 16 which monitors the amount of charge during charging and discharging of the battery pack 12.

BMU 13 keeps cell-balance of cells connected in series as needed. For example, it monitors whether the voltage of each cell is proper and/or whether the current at charging and discharging is within the allowable range. Also, if the voltage of a certain cell has reached to a specific value during charging, the current to the cell is bypassed to a resistor which had been separately provided. Voltages of all the cells are adjusted for example by charging other cells until the cell voltages become a specified value. Herein, as a cell balance circuit, types other than the resistance type described here are known, and it is not limited to the resistance type.

The coulomb counter 16 that can be used that calculates a current value from the voltage across a detecting resistor (so-called sense resistor) in which the charging and discharging current flows, and accumulates the value to obtain a SOC value.

By the way, in the measurement of the SOC value by the Coulomb counter 16, accumulation of errors may occur due to divergence or offset-drift associated with the progress of the deterioration of the battery. In order to reset the accumulation of errors, it is preferable to reset the coulomb counter 6 periodically. This reset may be carried out, for example, by charging a storage battery to fully charged state after discharging it completely, and measuring the amount of charge during this process.

Data of the amount of charge at fully charged state after the reset can be stored in any storage area in the system. As an example, data of the amount of charge at fully charged state may be recorded in BMU 13, may be recorded in PCS 40, may be recorded in the controller module 50, or may be recorded in any combination of these.

When the above-described reset operation is in progress, the user is not able to use the storage battery temporarily. Power storage device 10 of the present embodiment is intended for stationary system and it is also contemplated for the use as a backup power source for home use. Therefore, the reset operation is preferably scheduled so as to be performed with a frequency and time slot that do not impair the convenience of user.

For example, the frequency may be every few months, and more specifically, it may be every six months, for example. As an example, complete discharge may be carried out by restricting the charging when the storage battery is used during the daytime. Interval between the reset operations may be equally spaced, but not necessarily limited thereto.

The trigger for the reset operation may be a control signal, for starting a reset operation, that is sent from the controller module 50 (see, details below) on a regular basis (for example, half-yearly, or the period after 3 months to 6 months or more from the last time operation). Alternatively, BMU 13 may perform a reset operation automatically at regular intervals.

Figure 2:
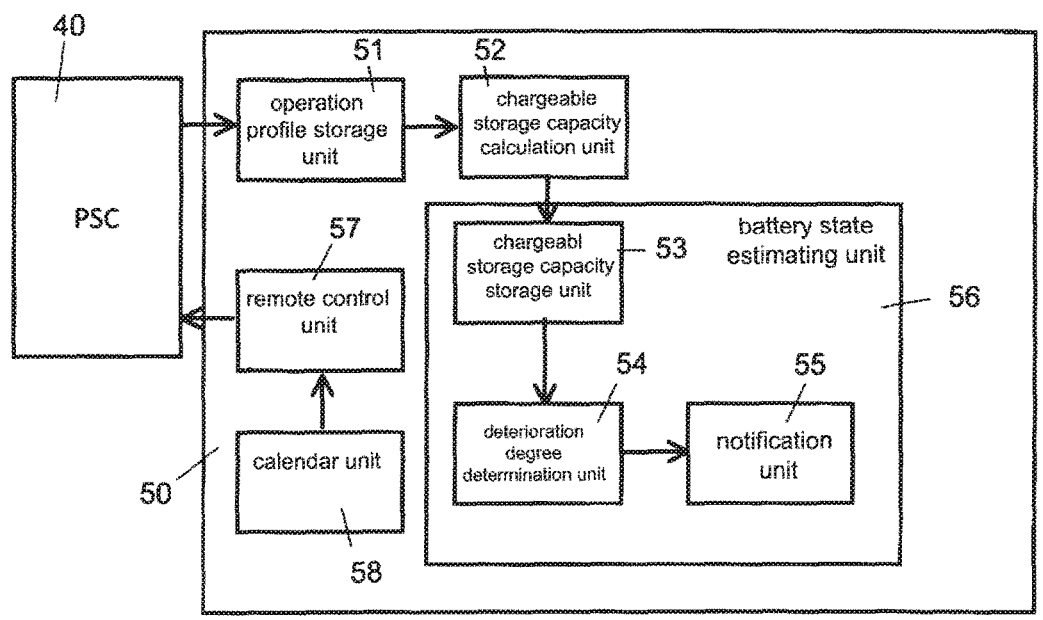
FIG. 2 is a block diagram showing the internal configuration of a controller module of FIG. 1.

If the controller module 50 includes a calendar unit 58 (functional block generating or acquiring information about date and time) as shown in FIG. 2, the transmission of the above control signal may be performed based on the information from the calendar unit 58. The frequency may be set in the calendar unit 58. It may be configured so that the remote control unit 57 makes a query to the calendar unit 58 on a regular basis, and if the time meets the timing of reset, the controller module 50 performs a reset operation of the coulomb counter remotely.

In this specification, the power storage device itself has been described as "power storage device 10 for stationary system". However, if it is considered as a unit of broader invention, it is also possibly described as a system comprising the power storage device 10 and a building (not limited to particular ones, but includes stores, houses and the like) accommodating thereof.

Next, PCS 40 and controller module 50 will be described.

PCS 40, as shown in FIG. 1, is connected to the power storage device 10, a system power supply and wirings to homes. Connection to the wirings to homes, in an example, may be connected via a switchboard and an inverter (not shown) or the like. PCS 40, in addition to the embodiment as shown in FIG. 1, may be connected via a solar panel and an inverter, and the like.

PCS 40 is configured to perform bidirectional communication with BMU 13 by using a predetermined communication system. PCS 40 has a function to make BMU 13 to perform charging and discharging of the battery pack 12 while communicating with BMU 13. PCS 40 has a function to monitor the system power supply. For example, it has a power meter, to record the power at each time. Also it communicates with the BMU to obtain voltage, current and temperature of the cell being monitored by the BMU. As the voltage, current and temperature of the cell, the values of a module may be employed in some cases instead of using the values of a single cell.

PCS 40 may have a buffer or memory (not shown in FIG. 1) for storing data, and may store data relating to voltage, current and temperature of the cell during a period. It may also have a function of transmitting to the outside (for example, the controller module 50) some or all of the stored data of the period.

Herein, PCS 40 may be located inside of the battery housing 11, or may be separated from the battery housing 11, or it is also possible in an embodiment that PCS is located in a battery and communicates with another upper PCS.

While detailed illustration is omitted, depending on the configuration of a lithium ion secondary battery, the system may have a unit called a system controller in addition to the PCS. In this case, the system controller bears a part of the functions of the PCS. The examples thereof includes a function for controlling an electric power supply through connection with the wiring of the system power supply or the wiring of home, or a function of performing charging and discharging while communicating with the BMU.

The controller module 50 is provided as a remote monitoring system, and is communicably connected to the PCS 40. Communication between the controller module 50 and PCS 40 may be performed via internet or LAN (may be either wired or wireless connection).

The controller module 50 may be configured as a computer (server) having, for example, a processor unit, a storage unit, a display device and the like. The processor unit includes a CPU (Central Processing Unit), a memory and the like. As the storage unit, a HDD (Hard Disk Drive) or a SSD (Solid State Drive) and the like may be used. The display device may be, for example, a display and the like, or a touch panel display and the like may be used in some cases.

As in other aspects, the controller module 50 may not necessarily be a stand-alone type, such as a server, and may be a microcomputer and the like incorporated as a component of other devices.

The controller module 50, in one example, may have an internal configuration as shown in FIG. 2. Each functional block in the figure depicted as "unit" may be realized by the CPU executing a computer program stored in the memory. Or it may be realized by hardware, or it may be realized by a combination of hardware and software. The computer program may be provided in a state stored in a storage medium.

In the example of FIG. 2, the controller module 50 has an operation profile storage unit 51, a chargeable storage capacity calculation unit 52, a chargeable storage capacity storage unit 53, a deterioration degree determination unit 54, a notification unit 55, a battery state estimating unit 56, a remote control unit 57 and a calendar unit 58.

The operational profile storage unit 51 stores an operation profile such as SOC, electric power at charge and discharge, the data of temperature. The "operation profile" will be described later with reference to FIG. 4.

Figure 3:
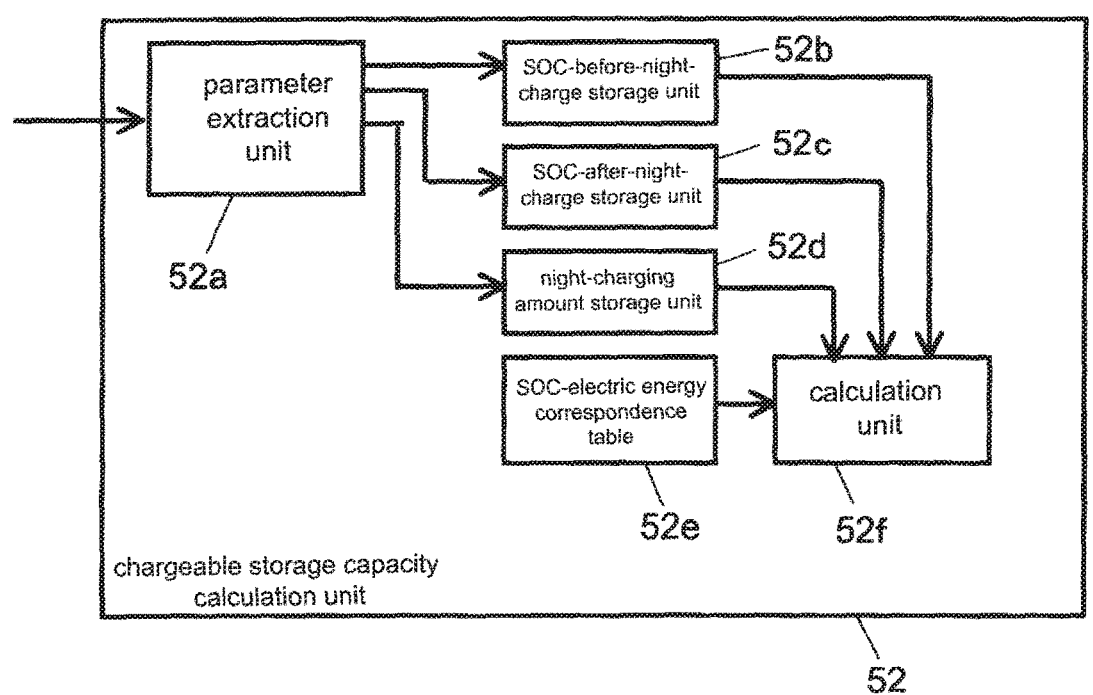
FIG. 3 is a block diagram showing the internal configuration of a chargeable storage capacity calculating unit.

The chargeable storage capacity calculation unit 52 is a unit that calculates a chargeable storage capacity. Specifically, the chargeable storage capacity calculation unit 52 may have functional blocks as shown in FIG. 3, i.e., a parameter extraction unit 52a, a SOC-before-night-charge storage unit 52b, a SOC-after-night-charge storage unit 52c, a charging energy in the night time storage unit 52d, a SOC-electric energy correspondence table 52e and a calculation unit 52f.

The parameter extraction unit 52a (FIG. 5) extracts, for example, the data of every day's SOC-before-night-charge, SOC-after-night-charge, and Charging energy in the night time and the like, respectively from the operational profile.

The calculating unit 52f calculates a chargeable storage capacity at calculating unit (see, below) by using the information of SOC-before-night-charge storage unit 52b, SOC-after-night-charge storage unit 52c, Charging energy in the night time storage unit 52d, and SOC-electric energy correspondence table 52e.

Chargeable storage capacity (Wh) is calculated according to the following equation:

Chargeable storage capacity ($Wh$)=(charging energy in the night time ($Wh$)+Converted value to $Wh$ from *SOC* before charging in the night time (*Wh*))/(*SOC* value after charging in the night time (%)/100)   Equation 1

Figure 13:
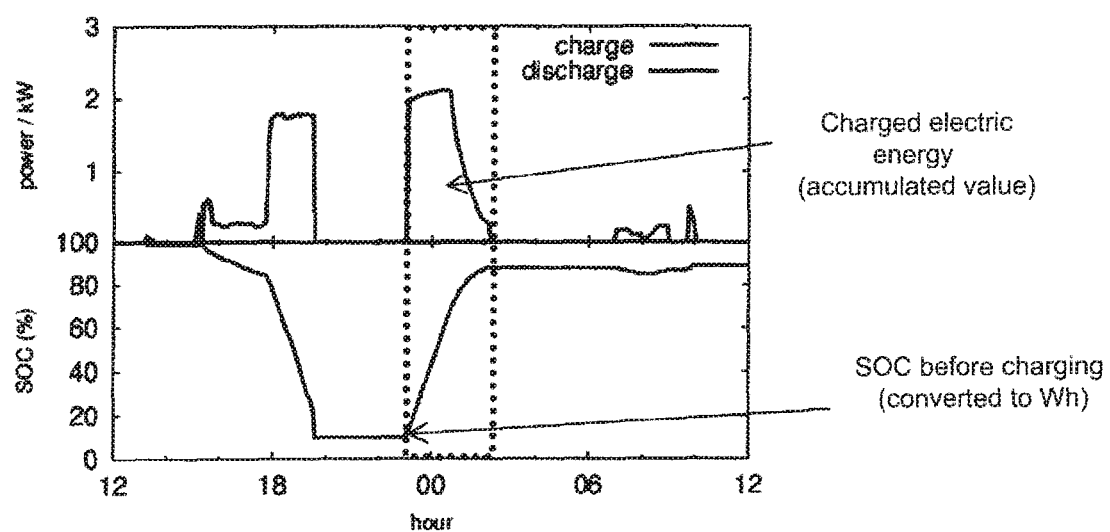
FIG. 13 is a diagram showing a change in electric power value and SOC in case of charging a storage battery at night.

Herein:

"Charging energy in the night time (Wh)" is electric energy supplied to the battery for charging of the battery during the night time (see item "Power" in FIG. 4 and also see FIG. 13).

"Converted value to Wh from SOC before charging in the night time Converted value to Wh from SOC before charging in the night time" is a value obtained by converting SOC value at start of charging into Wh unit. While SOC value in the example of FIG. 4 is "35 (%)", for the converted Wh value, a value measured separately and held in a table is referred to. See also FIG. 13.

"SOC value charging in the night time" is an SOC value at the time of the end of charging. While this value sometimes becomes "100 (%)", it may be less than "100%" in some cases, depending on a remaining battery level before charging or a charging time as a matter of course.

As the "Converted value to Wh from SOC before charging in the night time" and the "SOC value charging in the night time", charge ratios converted to Wh are used. This is because SOC measured by the coulomb counter relates to an amount of charge whereas electric energy is measured during charging and discharging, and therefore conversion to the same units are needed.

The calculated chargeable storage capacity is processed in the battery state estimating unit 56 (see FIG. 2). The chargeable storage capacity is stored in the chargeable storage capacity storage unit 53 in the battery state estimating unit 56. In the chargeable storage capacity storage unit 53, the history of the chargeable storage capacity from the past is retained.

FIG. 2 is again referred to. Based on the retained information, the deterioration degree determination unit 54 determines the presence or absence of deterioration and abnormality of the storage battery. Depending on the degree of deterioration or abnormality calculated in the deterioration degree determination unit 54, the notification unit 55 makes a notification. That is, in this example, the controller module 50 is configured to be able to make a determination of the deterioration degree and abnormality of a battery.

Figure 6:
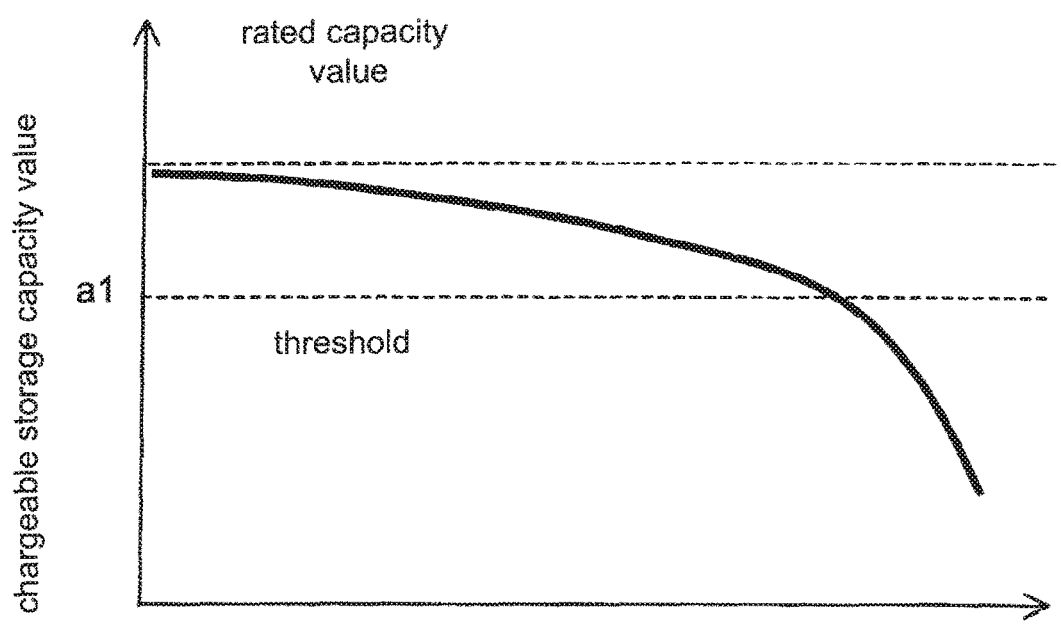
FIG. 6 is a diagram showing an example of the transition of chargeable storage capacity and a threshold setting for generating an alert.

Incidentally, as the one of the simplest determination, the examples thereof includes a method generating an alert by setting a certain threshold a1 with monitoring chargeable storage capacity value as shown in FIG. 6. In this method, however, it is necessary to determine the setting guidance of the threshold a1 by trial and error method. Therefore, the deterioration degree determination unit 54 determines the degree of deterioration and abnormality in three ways as follows.

The first method is to calculate the deviation from a capacity trend curve serves as a reference curve. This method is suitable for the detection of initial failure degradation, for example.

The second method is to calculate the deviation between the predicted value of life and the warranty period. This method is suitable for the detection of arrival of life within the warranty period, for example.

The third method is to calculate the acceleration degree of deterioration. This method is suitable for the detection of phenomena that deterioration proceeds rapidly in daily operation for example.

In the present embodiment, the system may be configured to be capable of implementing any one of or all of the above three methods. It may be configured to carry out the combination of any two of these. The system may be configured to allow a user to select and use any of these methods.

An example of the operational profile is shown in FIG. 4. The operational profile includes operation mode at each time, battery module temperature, amount of electric power during charge and discharge, and the like. Here, the data from 22:45 to the next 00:00 in certain one day are shown. Items are time, operation mode, temperature, electric power, SOC, and trained capacity.

the present inventor has investigated the past operational profiles and found that the best way is to utilize nighttime charge, for a suitable management parameter for the remote monitoring. This utilizes a nighttime electric power that is cheaper than the daytime electric power, and there is regularity that discharging takes place during the daytime and charging takes place during the nighttime. Therefore, it will be handled as stationary data. Further, unlike the discharging during the daytime, the charging during the nighttime is continuously performed, and is therefore preferable in terms of data accuracy.

(First Method)

The first method (see FIG. 7) evaluates:

Qmodel(t)-Qmeas(t)

wherein, Qmodel(t) is a model curve of a model curve of a capacity trend curve and t denotes time.

Qmeas(t) is a relative value to the actual initial value of the chargeable storage capacity, Qmodel(t) is also a relative value to the initial value of the capacity.

{Qmodel(t)-Qmeas(t)} represents a deviation from the deterioration reference. In this case, since the actual chargeable storage capacity Qmeas(t) contains noise, it is preferable to perform a smoothing such as moving average or Savitzky-Golay filtering.

Figure 7:
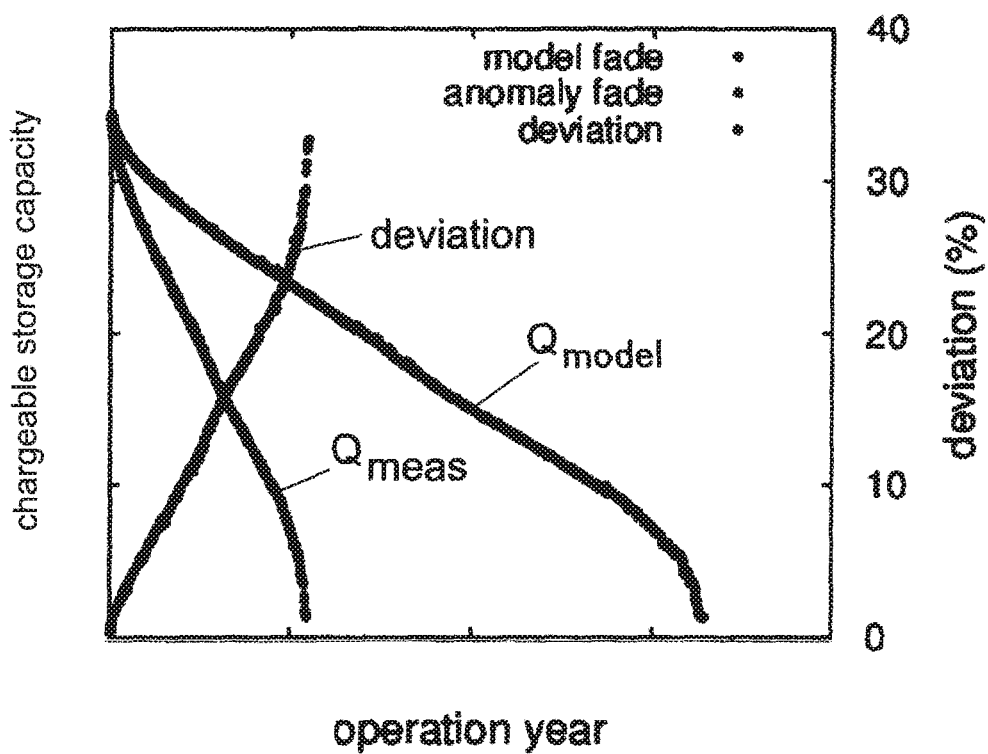
FIG. 7 is a diagram showing an example of an abnormality detection based on the evaluation of difference between a model trend curve of the capacity and an actual operation data (a first method).

FIG. 7 shows an example of the evaluation of Qmodel(t)-Qmeas(t) using the data of the lithium-ion battery cell, wherein the horizontal axis indicates time (operation period) and the vertical axes are chargeable storage capacity of a storage battery and deviation percentage.

In one aspect of the present invention, chargeable storage capacity (Wh) of the storage battery is calculated based on the resultantly obtained SOC values and the like while preventing the accumulation of errors by resetting the coulomb counter 16 periodically. Then, the deviation can be calculated and determined using this chargeable storage capacity (Wh) obtained every day (as an example) and the equation as described above. In an embodiment, it is possible to generate an alert in accordance with the deviation percentage. For example, the system may be configured to generate an alert at the values of 10%, 20% and the like. The step of calculation and determination as described above may be performed automatically by a computer or the like, or may be performed based on an instruction by a user. The same applies to the steps of calculation, determining and the like described below.

Specifically, an amount of deviation (deviation percentage) is obtained by comparing a storage battery capacity and a model trend curve, then determination is made whether it exceeds a reference value (such as 10%, 20%, etc.). If it exceeds the reference value, the alert may be generated (one or combination of sound, light, image, vibration and the like).

The above first method can be put into practice immediately after the start of operation if a model curve of a capacity trend curve has been obtained separately in advance, because there is no need of training with the actual operational data and.

The data for the trend curve may be read from, for example, a network (through internet, LAN, etc.), or the system may have a configuration that the power storage device 10 has the data of a trend curve corresponding to the storage battery, and the controller module 50 reads the data therefrom.

(Second Method)

The second method is to ascertain and monitor the degree of deterioration by predicting the life of the storage battery at a particular time, based on the trend data of the chargeable storage capacity, or by, in addition to this, calculating a rest of life (remaining available period).

Figure 8:
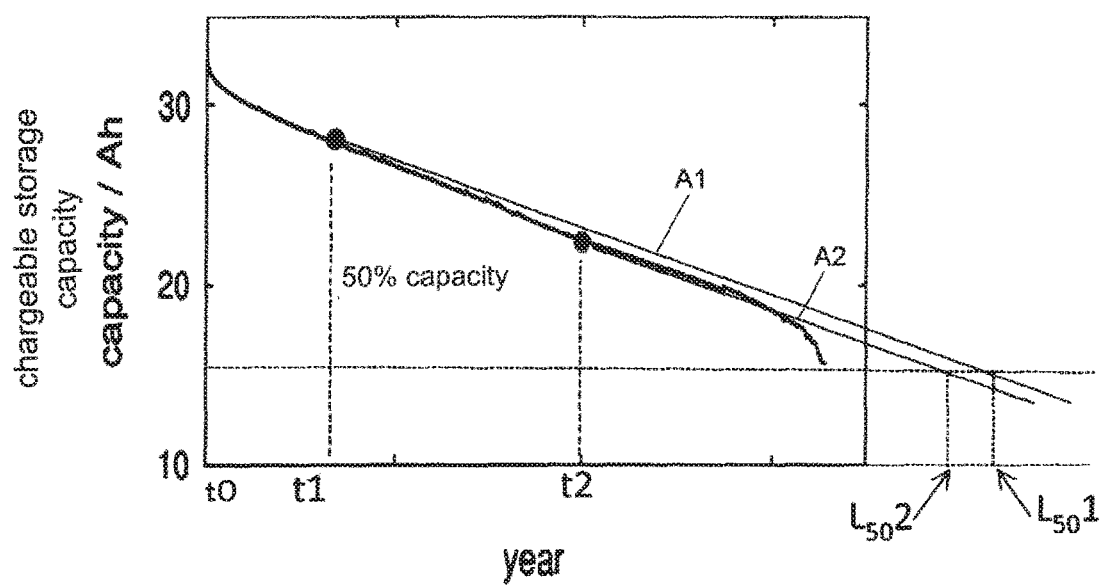
FIG. 8 is a diagram illustrating an example of predicting the capacity retention ratio of 50% as a life (second method).

With reference to FIG. 8, the life at which the chargeable storage capacity decreases to 50% of the initial value (hereinafter, 50% life) will be described below as an example. In FIG. 8, the horizontal axis represents time (operation period) and the vertical axis represents a chargeable storage capacity of the storage battery. 50% lifetime is drawn in broken line (horizontal).

First of all, as a life time prediction at time t1, modeling of chargeable storage capacity is performed based on the training with the past chargeable storage capacity in the period from the start of operation t0 up to the first time point t1 (first training period). An autoregressive moving average model may be utilized here. In this example, a trend curve A1 predicting the future is obtained, and X-coordinate at the intersection of the curve and the line of 50% life is a life time $L_{50-1}$ at the time point of t1. A trend curve A2 is a curve obtained by performing similar modeling in the period from t1 to t2, according to which a life time is $L_{50-2}$.

As a modeling method, in addition to autoregressive moving average model, autoregressive sum moving average model and the like may be utilized.

The first training period (t0-t1) may be 3 months or more, 6 months or more, 1 year or more, 3 years or more, 5 years or more; but not limited to these.

In one aspect of the present invention, the calculation of the first life time $L_{50-1}$—first time point t1 (operation period) also gives the rest of life of the storage battery. The numerical value of the thus determined rest of life ROL (Rest of Life) may be displayed on a display device (eg, a display).

Figure 9:
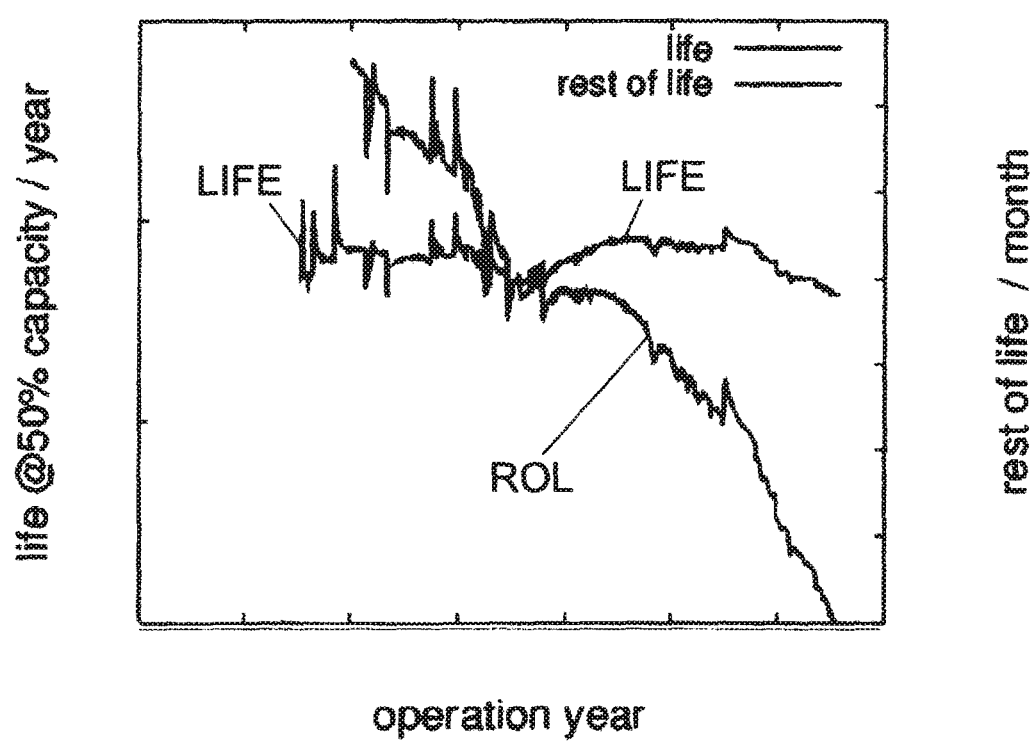
FIG. 9 is a diagram showing an example of life at which the capacity retention ratio reaches 50% as obtained by calculation technique of FIG. 8, and rest of life.

FIG. 9 shows the change of the rest of life ROL and the like. In this example, although the curve indicating the predicted life time is not so much changed, the rest of life decreases with time monotonically.

Herein, the system may be configured such that the rest of life is monitored and an alert may be generated in accordance with the threshold value set. For example, alerts may be generated when the rest of life reaches to six months or 3 months as threshold values.

(Third Method)

Figure 10:
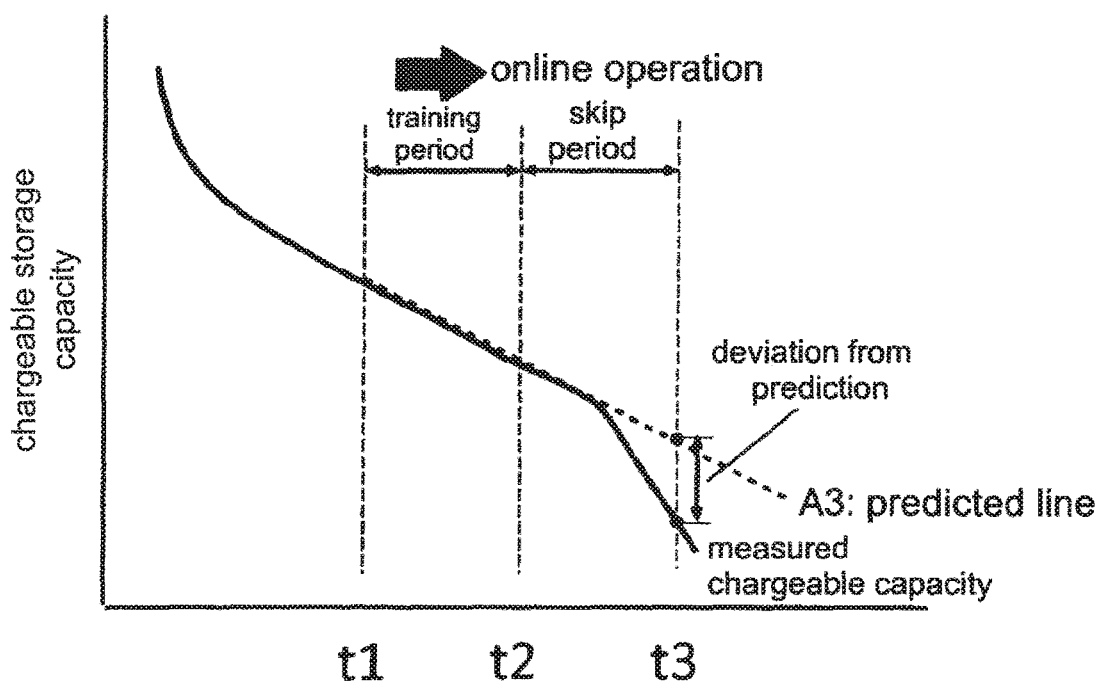
FIG. 10 is a diagram showing an example of a concept of detecting abnormality (third method).

The third method is to ascertain and monitor the deviation from the most recent trends by predicting future changes from the trend of the chargeable storage capacity up to the present time. This method will be described with reference to FIG. 10. Herein, we assume that the chargeable storage capacity at the time of t3 is known.

First, the system is trained with the data of the chargeable storage capacity during the period from the first time point t1 to the second time point t2, based on which the trend of change, namely predicted trend line A3 (predicted line) is obtained (see, broken line in FIG.).

Then, the difference between the chargeable storage capacity at the time t3 (measured chargeable capacity) and the value on the predicted trend line is obtained. Here, the time t3 is not very close to the time t2, and is set after the lapse of a period by at least 1 month or more, 2 months or more or three months or more and, for example, 12 months or less. By taking the time in this way, it is possible to reduce the sensitivity to noise on the measurement. The upper limit of this period may be set as, for example, approximately 5% to 10% of the life as set force in specifications of the storage battery.

Figure 11:
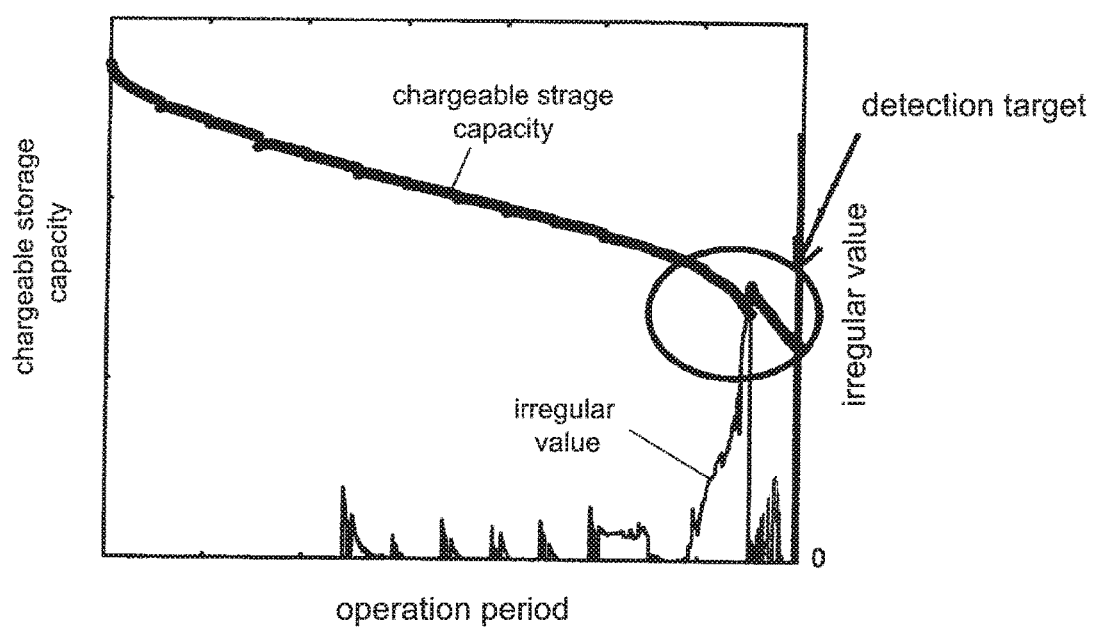
FIG. 11 is a diagram showing an example of object of abnormality detection and irregular values obtained from cell data, score of irregular values and irregular values of score of irregular values.

Next, the result verifying the third method will be described with reference to FIG. 11. The detection target in this case is the behavior in the area encircled by the ellipse in the right of the figure. In FIG. 11, the change of the chargeable storage capacity and the irregular values are shown. In the example shown in FIG. 11, the training period (t2-t1) is 3 months, and the period from the end of the training period to the present time (t3-t2) is 3 months.

From FIG. 11, at least from the data of this time, it was found that the irregular values best indicate the occurrence of the target of detection. Depending on the nature of the data, there may be used a score of the irregular values, or a score of irregular values respect to the former score after smoothing the sore and re-modeling are performed. The score value, in one example, is $-\log(p(t1))$ that is obtained by adding a minus sign to the logarithm of probability density function value p, when m is taken as average value of the capacity value in the training period, and $\sigma$ is taken as a standard deviation. As the calculation of scores, in addition to the above, Hellinger score may be used in some cases. In addition, while the time-series models such as regression model is used for the training, independent models such as a Gaussian mixture distribution histogram may also be used.

Figure 5:
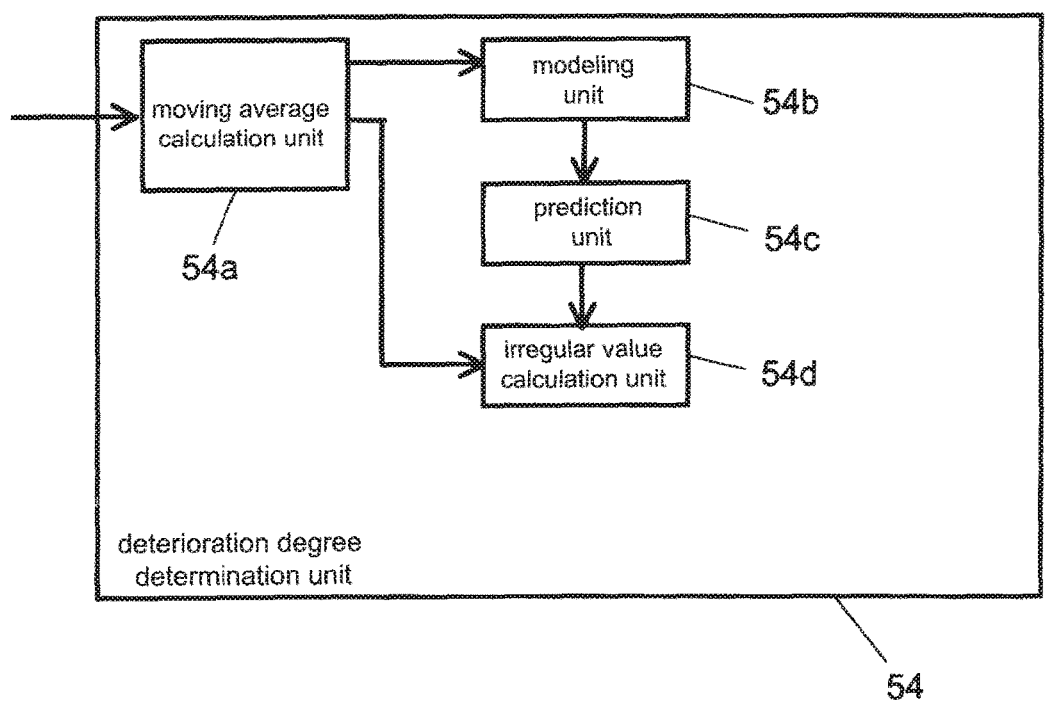
FIG. 5 is a diagram showing an internal configuration of the deterioration determination unit.

While not particularly limited, an example of a deterioration degree determination unit is shown in FIG. 5. FIG. 5 relates to the third determination methods described above. The deterioration degree determination unit 54 comprises, a moving average calculation unit 54a for calculating the moving average, a modeling unit 54b for performing modeling based on the results thereof, a prediction unit 54c further performing prediction from the modeling, and an irregular value calculation unit 54d for calculating irregular values.

Figure 12:
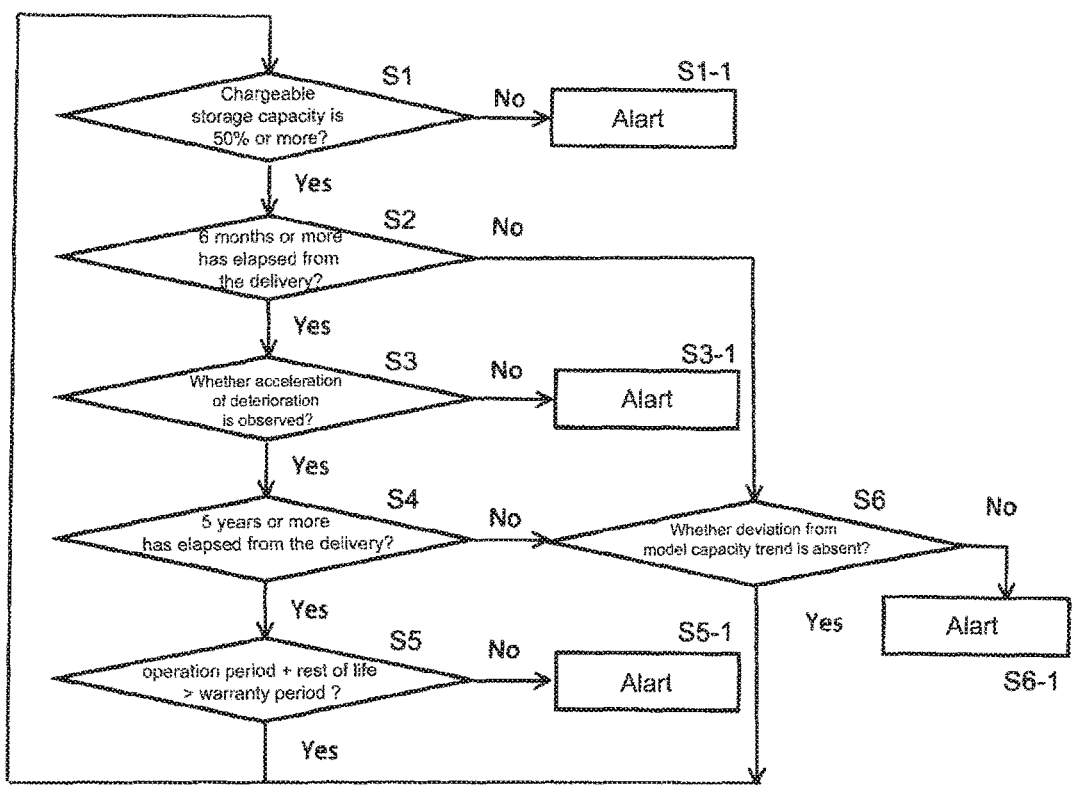
FIG. 12 is a diagram showing an example of the flowchart of abnormality detection.

Subsequently, an example of a flow for detecting regularly abnormalities is shown in FIG. 12. In the example of FIG. 12, capacity retention rate of 50% is set as an evaluation criterion. The order or the like of the steps described below may be appropriately modified within the scope of the present invention.

During operation period of the power storage device, firstly, the judgment of chargeable storage capacity is performed as step S1. Whether the chargeable storage capacity is below a threshold value (e.g. 50%) is judged. If it is less than 50%, an alert is generated (S1-1). The judgement in step S1 may be performed by a prescribed computer or an equipment (e.g., the controller module 50) in the system. The same applies to the steps described below.

Next, in step S2, the judgment is made as to whether a trainable period has arrived. Herein, 6 months term is intended. If it has not elapsed, a comparison with the model capacity trend of the above-mentioned method 1 is performed (step S6), and if there is a deviation, an alert is alarmed (step S6-1). If there is no deviation, the system keeps waiting until next detection.

If the judgment has determined the arrival of the trainable period in step S2, training becomes possible from the trend data of the chargeable storage capacity, and the above-mentioned method 2 and/or the method 3 is performed.

In step S3, the judgment is made as to whether an acceleration of the deterioration is observed by the above method 3. If the acceleration of the deterioration has been observed, an alert is generated (step S3-1).

If there is no abnormality, then, in step S5, the judgment is made as to whether a sufficient long operation period has elapsed (for example, a few years or more, and more specifically, five years or more) enough to estimate the rest of life.

If the judgment about the rest of life is not possible, the system proceeds to step S6 and evaluates the deviation from the model capacity trend of the method 1. If the judgment has been made already as in the case that the period is within 6 months or less from the delivery like in the above example, the evaluation is skipped.

If the rest of life can be estimated, the system proceeds to step S5, and the judgment is made as to whether the sum of the operation period up to now and the rest of life is longer than a warranty period. If the sum of the operation period and the rest of life is shorter than the warranty period, an alert is alarmed (S5-1). If the sum of the operation period and the rest of life is longer than the warranty period, the system keeps waiting until next detection.

The abnormality detection in regular basis as shown in FIG. 12 may be carried out approximately once a day or once a week. The system may automatically perform the abnormality detection in regular basis.

The generation of the alert may be performed at several stages depending on the judgment. For example, setting may be made to two stages such as 5% or more and 10% or more with respect to the deviation from the model capacity trend, and two stages such as 5% or more and 10% or more with respect to the deviation from the past trend in the judgement of the acceleration of the deterioration. In addition, in the estimation of the rest of life, the rest of life itself may be judged with setting of three stages, for example, 1 year, six months and three months with respect to the rest of life.

As described above, according to one aspect of the present invention, since the amount charge in the coulomb counter 16 is reset, the accumulation of errors is prevented. Moreover, since the reset is carried out at intervals that do not impair the convenience of users (for example, once every half year), the users do not frequently experience cases in which batteries are unusable.

Further, based on the trend of the chargeable storage capacity of the lithium ion secondary battery obtained after conducting the above reset, the use of any of the first, second and third methods or the combination of these allows the detections such as (i) detection of initial failure degradation, (ii) detection of arrival of life and (iii) detection of deterioration phenomena that proceeds rapidly.

The system and the method of the present embodiment are also advantageous in ascertaining the state of a battery without an increase in costs. To avoid the increase in costs, it is also desirable to minimize the amount of data to be acquired as small as possible. This is because a large storage memory of the storage device for storing data tends to lead to an increase in costs. In addition, from the point of view of labor costs, it is desirable to minimize works for inspection made by field service persons at the locations of actual individual machines. For these problems, a system that allows remote and automatic state ascertaining is desired. In the present embodiment, it is possible to utilize the controller module 50 as a remote monitoring system to realize the above system.

As described above, embodiments of the present invention has been explained with reference to the drawings. However, the present invention is not limited to the above, and various modifications are possible. For example, while the lithium ion secondary battery placed in a house is assumed in the above description, the location to be installed is not limited to houses in the present invention. For example, it may be installed in stores, factories, condominiums and office buildings. In addition, it may not be necessarily installed in a living area of a user. For example, installation in premises of substations or power stations (such as of wind power or solar power) is not excluded, too.

The constituent elements described above are not necessarily limited to separate components. For example, a configuration in which a plurality of constituent elements are assembled into one module may be used, a configuration in which one constituent element is realized by assembling a plurality of modules may be used, a configuration in which a constituent element is a part of another constituent element may be used, a configuration in which a part of a constituent element overlaps with a part of another constituent element may be used, or a similar configuration may be used.

The order of the operations shown in the flowchart above is not intended to limit the present invention but the order of the operations according to the present invention can be modified within a range where the contents thereof are not impaired. Moreover, occurrence of an operation may be allowed during performing another operation and timing of performing an operation may be allowed to overlap with timing of performing another operation partially or entirely, among others. Physical configurations of the element are not limited by the description of the embodiment above, and they may be provided independently, may be present in combination, or may be configured separately.

INDUSTRIAL APPLICABILITY

Examples of applications of the present invention includes stationary storage batteries installed in houses, stores, offices, factories, substations and the like, or storage batteries using a lithium ion secondary battery used for artificial satellites.

DESCRIPTION OF THE REFERENCE NUMERALS 10 power storage device
11 housing
12 battery pack
13 BMU
15 controller module (remote monitoring system)
16 Coulomb counter
40 PCS
50 controller module
51 operation profile storage unit
52 chargeable storage capacity calculation unit
53 chargeable storage capacity storage unit
54 deterioration degree determination unit
55 notification unit
56 battery state estimating unit
57 remote control unit
58 calendar unit

The invention claimed is:
1. A state ascertaining system comprising:
a power storage device for a stationary system comprising a storage battery and a charge-discharge controller connected the storage battery; and
a controller directly or indirectly connected to the power storage device;

wherein the power storage device comprises a charge measuring device for determining an charging energy based on charge and discharge current of the storage battery, and the controller is configured to allow discharging the storage battery completely and updating data of a charging energy at a fully charged state, and the controller is further configured to perform:

storing operating history data of a storage battery;

estimating a chargeable storage capacity of the storage battery by using the operating history data and the updated data of the amount of charge at the fully charged state;

determining a predicted trend line of the chargeable storage capacity, based on a transition of the chargeable storage capacity during a period from a first time point to a second time point; and evaluating a difference between an estimated chargeable storage capacity and a value on the predicted trend line, both at the second time point and at a third time point when a predetermined time has elapsed from the second time point.

2. The state ascertaining system according to claim 1, wherein the regular interval is in a range of 3 months to 9 months.

* * * * *